(12) United States Patent
Wenham et al.

(10) Patent No.: US 6,429,037 B1
(45) Date of Patent: Aug. 6, 2002

(54) SELF ALIGNING METHOD FOR FORMING A SELECTIVE EMITTER AND METALLIZATION IN A SOLAR CELL

(75) Inventors: Stuart Ross Wenham, Menai Heights; Martin Andrew Green, Bronte, both of (AU)

(73) Assignee: Unisearch Limited, Sydney (AU)

( * ) Notice: Subject to any disclaimer, the term of this patent is extended or adjusted under 35 U.S.C. 154(b) by 0 days.

(21) Appl. No.: 09/720,071
(22) PCT Filed: Jun. 29, 1999
(86) PCT No.: PCT/AU99/00522
§ 371 (c)(1),
(2), (4) Date: Dec. 20, 2000
(87) PCT Pub. No.: WO00/01019
PCT Pub. Date: Jan. 6, 2000

(30) Foreign Application Priority Data

Jun. 29, 1998 (AU) .............................................. PP 4375

(51) Int. Cl.⁷ ............................................. H01L 21/268
(52) U.S. Cl. ............................. 438/57; 438/98; 438/73; 438/558; 438/597; 438/795
(58) Field of Search .............................. 438/57, 96, 97, 438/98, 69, 72, 73, 74, 542, 549, 550, 558, 559, 563, 597, 584, 637, 795, 798, 778, 783, 784, 787; 117/94; 427/554, 596; 136/255; 204/192.17

(56) References Cited

U.S. PATENT DOCUMENTS

| | | | |
|---|---|---|---|
| 4,147,563 A | * 4/1979 | Narayan et al. | 148/1.5 |
| 4,181,538 A | * 1/1980 | Narayan et al. | 148/1.5 |
| 4,251,285 A | * 2/1981 | Yoldas et al. | 252/950 |
| 4,273,950 A | * 6/1981 | Chitre | 136/255 |
| 4,322,571 A | 3/1982 | Stanbery | |
| 4,345,967 A | * 8/1982 | Cook | 427/86 |
| 4,377,901 A | * 3/1983 | David et al. | 436/256 |
| 4,589,191 A | * 5/1986 | Green et al. | 29/572 |
| 5,011,565 A | * 4/1991 | Dube et al. | 204/15 |
| 5,011,567 A | * 4/1991 | Gonsiorawski | 427/53.1 |
| 5,258,077 A | * 11/1993 | Shahryar | 136/256 |
| 5,461,002 A | * 10/1995 | Safir | 438/558 |
| 5,888,890 A | * 3/1999 | Kim | 438/559 |
| 5,918,140 A | * 6/1999 | Wickboldt et al. | 438/535 |
| 5,928,438 A | * 7/1999 | Salami et al. | 136/255 |
| 6,040,019 A | * 3/2000 | Ishida et al. | 427/526 |
| 6,210,991 B1 | * 4/2001 | Wenham et al. | 438/97 |

* cited by examiner

Primary Examiner—Savitri Mulpuri
(74) Attorney, Agent, or Firm—Jordan and Hamburg LLP

(57) ABSTRACT

A method of making contacts on solar cells is disclosed. The front surface (41) of a substrate (11) is coated with a dielectric or surface masking layer or layers (12) that contains dopants of the opposite polarity to those used in the surface of the substrate material (11). The dielectric layers or layers (12) not only acts as a diffusion source for forming the emitter for the underlying substrate (11) when heat treated, but also acts as a metallization mask during the subsequent electroless plating with solutions such as nickel and copper. The mask may be formed by laser scribing (14) which melts the layer or layers (12), thereby more heavily doping and exposing zones (15) where metallization is required.

22 Claims, 3 Drawing Sheets

SELF ALIGNING METHOD FOR FORMING A SELECTIVE EMITTER AND METALLIZATION IN A SOLAR CELL

INTRODUCTION

The present invention relates generally to the field of photovoltaic device manufacture and in particular, the invention provides a self aligning method of metallization formation in a photovoltaic device.

BACKGROUND OF THE INVENTION

Many approaches exist for diffusing dopants of one polarity into the surface of a substrate doped with the opposite polarity so as to form a p-n junction. One such approach involves the deposition of a dielectric containing the appropriate dopants onto the surface of the oppositely doped substrate followed by appropriate thermal treatment to allow the dopants from within the dielectric to diffuse into the substrate surface. Examples of techniques for carrying out the thermal treatment include conventional quartz tube furnaces infrared belt furnaces rapid thermal anneals, and the use of lasers.

It is also well documented in the literature, that spatially selective emitters can be important for the achievement of high efficiencies. Heavy doping beneath the metal contact is important, both for reducing contact resistance and also to minimise the contribution made to the dark saturation current for the solar cell by the silicon/metal interface region. For the latter, the heavy doping makes it possible to locate the high surface recombination velocity region associated with the metal/silicon interface more than a minority carrier diffusion length away from the p-n junction, thereby minimising the contribution made to the device dark saturation current by the metal contact. The highest performance commercially available solar cells achieve the heavy doping under the metal by forming a groove through a lightly diffused emitter at the top surface and then subsequently diffusing large amounts of dopant into the walls of the exposed grooves prior to plating the metal contacts also within the grooves where the heavy doping exists. This provides the advantages described above while leaving the majority of the top surface lightly diffused, therefore preventing the formation of a surface dead layer which would otherwise exist if the heavy doping extended across the light receiving surface. The lightly diffused emitter in conjunction with adequate surface passivation enables the achievement of high carrier collection probabilities for carriers generated throughout the depth of the lightly diffused emitter. The disadvantages of this approach include the necessity for two independent diffusion processes, which adds cost and complexity and also possible degradation of the substrate quality through the long high temperature exposure needed to achieve the heavy doping within the grooved region. A third disadvantage of this approach results from the necessity for a damage/debris removal etch following the grooving process to prepare the silicon surfaces within the groove for the subsequent diffusion.

Another approach for achieving the selective emitter with heavy doping beneath the metal contact has been reported by U.Besi-Vetrella et alia ("Large area. Screen Printed Silicon Solar Cells with selective Emitter made by Laser Overdoping and RTA Spin-on Glasses". 26$^{th}$ IEEE Photovoltaic Specialists Conference, Anaheim. 1997, p.135.). This approach involved the use of a spin-on diffusion source to facilitate formation of the lightly diffused emitter followed by the use of a laser to heat localised regions of the silicon surface at which heavy doping is desired. The pattern formed by the laser is identical to that required for the metallization but with a major complication being the subsequent difficulty of aligning the metal to these heavily diffused regions. Besi-Vetrella et alia, have developed sophisticated techniques for carrying out this alignment for the purposes of screen printing the metal paste onto the heavily diffused regions. A further complication with this work includes the fact that regions of the screen printed metal extend beyond the heavily diffused regions onto the lightly diffused regions with detrimental consequences in increasing the device dark saturation current and potentially leading to the problem of metal penetrating to the p-n junction during heating and perhaps even causing the shunting of the entire device. The latter problem could be overcome by ensuring the heavily doped lines formed by the laser are wider than the screen-printed metal lines. They would need to be wider by a sufficient margin to allow for any alignment tolerances associated with aligning the screen printed metal to the heavily diffused regions over the entire length and width of the solar cell surface. Again however there are detrimental consequences to this approach, including increased dark saturation current resulting from the substantially larger volumes of heavily doped material, the formation of surface dead layers where the heavy doping extends beyond the edge of the screen printed metal, and the increased laser processing necessary to achieve the much greater line widths. In combination, these disadvantages would lead to lower performance and higher cost, compared to a self aligned approach for the metal contact formation if the latter were achievable. The final disadvantage relates to surface passivation. The lightly diffused surface regions require adequate surface passivation to achieve good performance while the described dielectrics which can potentially passivate the surface, can also subsequently cause problems when trying to make contact between the screen printed metal and the heavily doped silicon. A possible solution is to remove the dielectric prior to screen-printing, carry out the screen-printing process, and then subsequently re-passivate the surface without causing damage to the metallization. Even if this is achievable, it adds considerable cost and complexity to the process.

SUMMARY OF THE INVENTION

The present invention provides a self aligning method of forming contact metallization in a solar cell, the method including the steps of:

a) on a surface of a semiconductor substrate of a first dopant type, forming a continuous layer of dopant source material of a second dopant type of opposite dopant polarity to that of the first dopant type, the source material being selected to also act or to be made able to act as a surface passivation layer and a metallization pattern mask;

b) thermally treating the dopant source and the semiconductor surface carrying the dopant source, whereby a surface region of the second dopant type is formed in the semiconductor material, the first and second doped semiconductor types forming a p-n junction beneath the surface of the semiconductor substrate;

c) locally heating the dopant source and the underlying semiconductor surface to cause melting of the surface region in zones where metallization is required to contact to the surface region whereby the melted zones of the semiconductor surface region are more heavily doped from the dopant source and the overlying dopant source material is disrupted to expose the more heavily doped surface zones;

d) forming metallization over the heavily doped surface zones such that connection to the surface region of the semiconductor material is made through the disruption in the dopant source layer to the heavily doped surface zones.

Preferably, the source material will also be chosen to form an antireflection coating.

In one embodiment, the dopant source layer is a single layer of dielectric material carrying a dopant source whereby the dielectric material acts as a dopant source, a passivation layer, a metallization mask and perhaps also an anti reflection coating, however, in other embodiments, a doped passivation layer is provided with a dielectric layer formed over it to act as a metallization mask, in which case, the localised heating step must disrupt both the dopant passivation layer and the dielectric layer. In this case, one of the layers may also act as an antireflection layer or a separate antireflection layer may be provided.

The first heating step is performed with parameters chosen to result in a surface region doping level in the range of 50–800 ohms per square and preferably in the range of 80–200 ohms per square.

The second localised heating step is preferably performed with a laser to enable concentrated heating in a small well defined area of the device. The laser may be a continuous wave laser or a pulsed (Q-switched) laser, however, in the latter case, the laser will generally be defocussed to prevent (or at least minimise) ablation during the heating step or else a wavelength at which laser energy will be absorbed close to the surface of the substrate.

BRIEF DESCRIPTION OF THE DRAWINGS

Embodiments of the invention will now be described by way of example, with reference to the accompanying drawings in which.

DETAILED DESCRIPTION OF THE PREFERRED EMBODIMENTS

Figure 1:
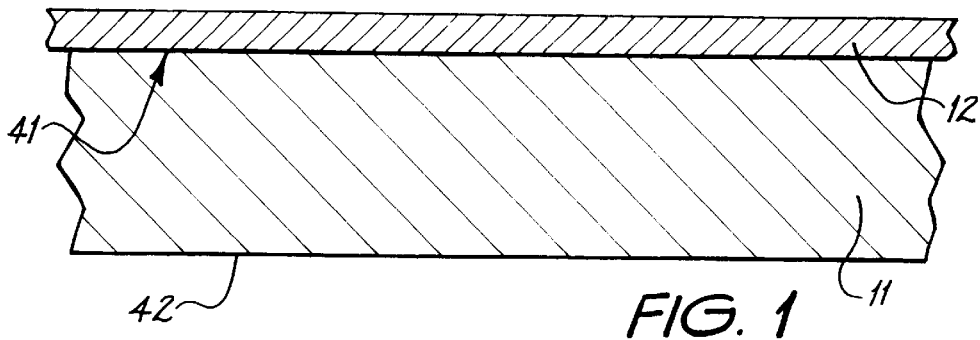
FIG. 1 illustrates a cross section through a partially fabricated solar cell device made in accordance with a first embodiment of the invention after a first phase of the fabrication method.
Figure 2:
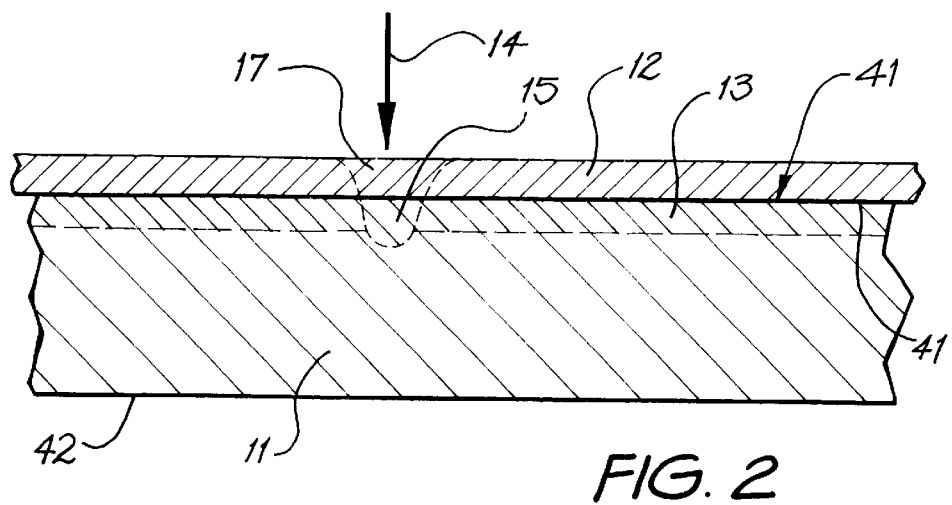
FIG. 2 illustrates a cross section of the solar cell device of FIG. 1 after further processing.

Referring to FIG. 1, in embodiments of the present invention, the front surface 41 of a substrate 11 is coated with a dielectric or surface masking layer 12 that contains dopants of the opposite polarity to those used in the surface of the substrate material 11. However, the dielectric layer or layers 12 are chosen to not only act as diffusion source for forming the emitter for the underlying substrate 11 when heat treated, but also to subsequently act as a metal plating mask during the subsequent electroless plating with solutions such as nickel and copper and then ultimately, potentially as an antireflection coating. Some commercially available spin-on diffusion sources can be converted into a more suitable type of dielectric through appropriate heat treatments such as in the presence of oxygen so as to toughen up the resistance to the electroless plating solutions, but while still facilitating dopant diffusion into the silicon surface. Other dielectrics however can also be used such as silicon nitride and silicon dioxide, which can both act as suitable masks for the electroless plating solutions, while simultaneously acting as suitable diffusion sources when containing appropriate levels of the right dopants. Multiple layers of dielectrics or alternative surface layers are even feasible whereby one layer can contain the majority of dopants while the second dielectric layer provides suitable masking against the electroless plating solutions. Following the deposition of the dielectric layer or layers 12 onto the front surface 41 of substrate 11, appropriate thermal treatment can be used to lightly diffuse the surface region 13 (see FIG. 2) to a sheet resistivity preferably in the range of 100 to 200 ohms per square but also acceptably within the range of 50 ohms per square to 800 ohms per square.

Figure 3:
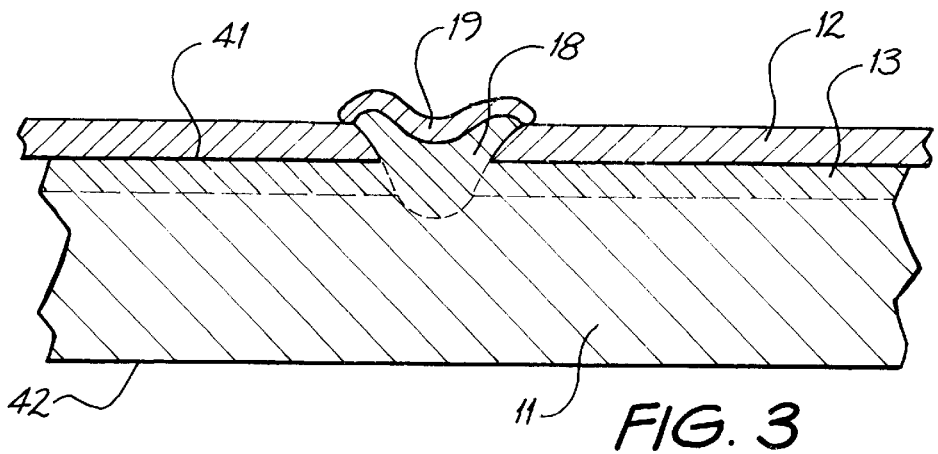
FIG. 3 is a cross section through the partially fabricated solar cell device of FIGS. 1 and 2 after metallization.
Figure 4:
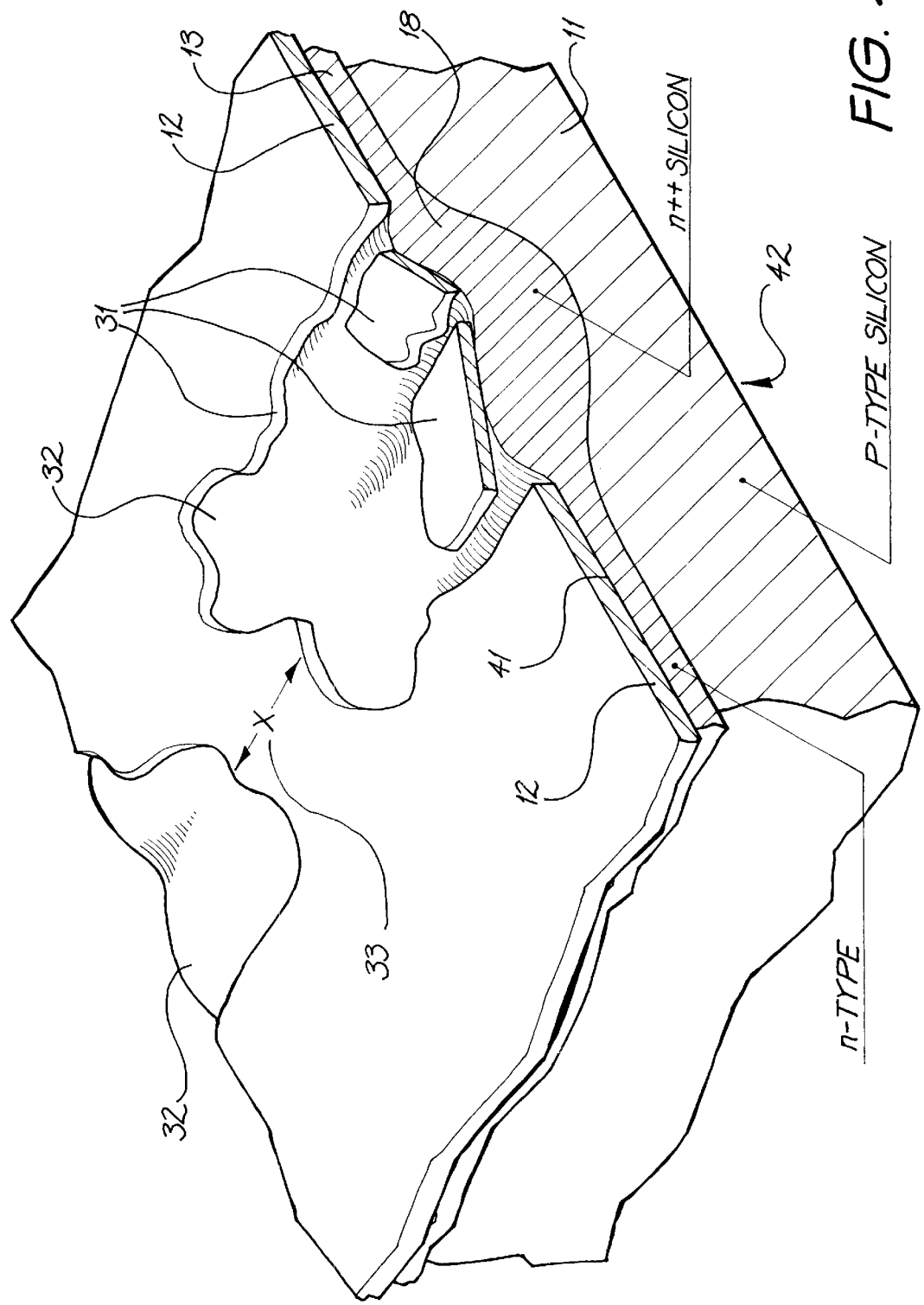
FIG. 4 illustrates the disrupted dielectric layer in the contact region of the device of FIGS. 1–3.

A laser 14 is subsequently used to melt the silicon in localised regions 15 (see FIG. 2) while simultaneously patterning the plating mask 12 where the metal contact is to be formed. Sufficient energy is delivered by the laser 14 to destroy the integrity of the overlying dopant containing dielectric layer 12 (such as by melting regions of the dielectric, or creating sufficient turbulence in the molten region to damage the overlying dielectric or causing sufficient thermal expansion in the silicon to damage the overlying dielectric etc.). Provided no or only minimal ablation of the silicon 15 and overlying dielectric 12 take place, the dopants are still released in large quantities into the underlying molten silicon 15 with the net result that the silicon material in the vicinity of the laser beam becomes heavily doped with the same polarity as the lightly diffused emitter 13. Provided the integrity or continuity of the overlying dielectric 12 is destroyed, subsequent electroless plating will lead to the formation of a metal contact 19 (see FIG. 3) with the same pattern as formed by the laser 14 in a self aligned process. The concept of plating across the surface 33 (see FIG. 4) of the dielectric 12 to provide continuity in the metal has been described by Green and Blakers in U.S. Pat. No. 4,859,191. It is therefore not essential for all the dielectric in the regions 17 exposed to the laser 14 to be removed or even damaged as such regions 32, 33 will be reached by the electroless plating to still form continuous metal lines 19 (FIG. 3), provided such regions 33 do not span right across a laser processed area for a length along the laser processed line of more than about 10 microns. In the example of FIG. 4, the damaged dielectric is sufficiently disrupted that subsequent metal plating will bridge across the laser processed region where the dielectric remains so as to give continuity in the metallization.

Excessive laser power will lead to the ablation of excessive amounts of heavily doped silicon and possibly even the overlying dielectric material. This can lead to insufficient dopant remaining in the grooved walls for good device performance. At the other extreme, insufficient laser power can lead to the inability to plate the heavily doped regions which remain protected by the overlying dielectric or alternatively insufficient dopants even penetrating into the silicon to facilitate good device performance. Between these extremes, there are wide ranges of laser conditions that can be used to satisfy the requirements of this invention. For example, a neodymium YAG laser with sufficient power can be used on continuous-wave mode to form the heavily doped region shown in FIGS. 3 and 4 with negligible ablation of the silicon but with the desired damage being caused to the overlying dielectric 12. Another example includes the use of the same laser in Q-switched mode, but with a significantly de-focused beam to again avoid significant ablation of the silicon while still achieving the other desired effects. A third example is to use a shorter wavelength laser, such as a frequency-doubled neodymium YAG laser of wavelength 0.53 microns. For this wavelength of laser, the light is more rapidly absorbed near the surface of the silicon making it easier to controllably melt the silicon with the desired turbulence without ablating the silicon, even on normal Q-switched mode of operation. Numerous other ways of controlling the laser beam can also be used to give the desired effects that satisfy the needs of this invention.

Following the laser treatment, the surface of the device can be directly plated provided the electroless plating solution used can tolerate thin surface oxides formed naturally during the laser treatment. If a plating solution is used that cannot tolerate surface native oxides, then a diluted hydrofluoric acid solution can be used for a short period to remove the thin surface oxides without significant damage to the remaining dielectric that protects the lightly diffused emitter regions. Common electroless plating approaches include an initial thin layer of nickel which following sintering at typically 350–400° C. is plated by electroless copper to the desired height following which a brief submersion in an "immersion silver" solution can be used to provide a thin silver capping layer over the copper to prevent future oxidation, possible interaction with encapsulants and make the metal contact more easily soldered.

The procedures described above can be interrupted through the inclusion of additional processes for other purposes such as the formation of the rear metal contact. For example, the rear metal contact may be formed on the rear surface 42 via a number of different possible techniques and could occur immediately following the light emitter diffusion or else following the laser treatment. Another possibility would be to apply a rear aluminium layer when using a p-type substrate near the beginning of the process so that the rear metal contact is sintered during the formation of the lightly diffused emitter.

Embodiments of the present invention are applicable to both planar and rough surfaces such as those textured or machined, although the laser parameters may need slight adjustment when swapping between the two surface types. For example, if the laser operating parameters are adjusted for good results with a planar surface when using a defocussed beam, the power should be slightly reduced for comparable results with a textured surface due to the more effective coupling of the laser energy into the textured silicon surface. The textured surfaces will also obliquely couple some of the laser light into the silicon with the net result that the laser processed $n^{++}$ silicon will usually form slightly wider lines than those for the planar case. Using standard neodymium YAG lasers of wavelength 1.06 microns, line widths when using defocussed beams will normally lie in the range of 30–80 microns while for a focused beam such as can be used with continuous wave mode of operation, line widths in the range of 10–25 microns width usually result with textured surfaces again giving slightly wider lines than for the corresponding planar surface types. Roughened surfaces also have the benefit that when melting, lead to a much greater change in the surface reflection, making this easier to detect.

EXAMPLES OF THE IMPLEMENTATION OF THE INVENTION

The following two fabrication processes are typical examples of how the above invention can be incorporated into a solar cell.

Example 1

1.1 Saw damage removal etch and anisotropic texturing in dilute sodium hydroxide at approximately 90° C.;
1.2 Application of phosphorus spin-on diffusion source plus drying;
1.3 Rapid thermal annealing of wafer top surface to form lightly diffused emitter preferably in the range 80–200 ohms per square;
1.4 Application of the rear metal contact such as by vacuum evaporation or screen-printing of aluminium or silver with small aluminium concentration; drying if appropriate:
1.5 Rear metal sintering such as at 820° C. in oxygen/nitrogen ambient for a screen printed contact so as to simultaneously fire the metal paste while oxidising the top surface dielectric to increase its resistance to the metal plating solutions;
1.6 Laser processing to pattern the dielectric layer while simultaneously melting the underlying silicon so as to form the $n^{++}$ region;
1.7 Brief dilute hydrofluoric acid treatment to prepare metal plating surface, Electroless nickel plating at approximately 90° C. for 5 minutes;
1.8 Sintering of nickel in the range of 350° C.–450° C. in inert atmosphere such as nitrogen, argon or forming gas;
1.9 Further two minutes of nickel plating prior to lengthy electroless copper plating at approximately 50° C. until the desired thickness of copper is achieved;
1.10 "Flash" immersion silver deposition onto the copper surface;
1.11 Edged junction isolation such as by laser grooving, edge cleavage or plasma etching or no edge isolation at all if not necessary.

In some implementations of the above processes, an additional oxide removal step from the surface of the rear metal prior to plating may be necessary depending on the type of metal used and the oxidation conditions during sintering. For instance, screen-printed aluminium after firing in an oxygen ambient forms a very thick oxidised layer which requires special treatment for removal as well documented in the literature.

Example 2

2.1 Saw damage removal etch and an isotropic texturing in dilute sodium hydroxide at approximately 90° C.;
2 1 Diffusion source deposition as a surface dielectric;
2.3 Formation of the lightly diffused emitter by heating at approximately 800° C. for 20 minutes depending on the dielectric type used;
2.4 Coin stacking of wafers for edge junction isolation via plasma etching;
2.5 Deposition of a second dielectric layer on top of the diffusion source to provide subsequent masking for the electroless plating solutions and an antireflection coating. Examples of such a dielectric would be atmospheric CVD of titanium dioxide or else low pressure CVD of silicon nitride or alternatively the first dielectric deposition prior to the formation of the lightly diffused emitter could have for instance, also been silicon nitride but already containing phosphorus dopants so as to avoid the deposition of two separate dielectric layers;
2.6 Screen print rear metal contact such as with aluminium doped silver paste, and dry;
2.7 Fire rear metal contact such as in an infrared belt furnace at 780° C. for approximately two minutes;
2.8 Carry out laser processing equivalently to step 1.6 in example 1;
2.9 Electroless plating of front and rear metal contacts as per steps 1.8 to 1.10 from example 1;

Many variations to the individual processes above could be used such as applying the metal contact prior to light emitter formation so as both processes can be simultaneously carried out with a single thermal process. Another example would be the inclusion of an oxidation process as part of step 2.3 to convert the existing dielectric into one that is able to act as a plating mask. This would potentially alleviate the need for the second dielectric in step 2.5.

Resulting device performance falls slightly behind that of the buried contact solar cell when the metallization pattern is optimised for maximum performance. The slightly higher losses result primarily from increased resistive losses that result from the poorer aspect ratio for the metallization. However, for most commercial solar cells, interconnect wires are used across the entire length of the cell therefore minimising the length of metal fingers needed to carry current from the edges of the cell across to the interconnects. This approach minimises the advantage of the buried contact solar cell with the present invention being able to achieve virtually the same performance on float zone material. On thermally sensitive material which includes many types of commercial grade substrates, this invention has advantages over the conventional buried contact solar cell by minimising the wafer's exposure to high temperatures and also reducing the length of time needed for the thermal processes. Higher performance may therefore be expected from this invention for some commercial substrates compared to the buried contact solar cell.

Figure 5:
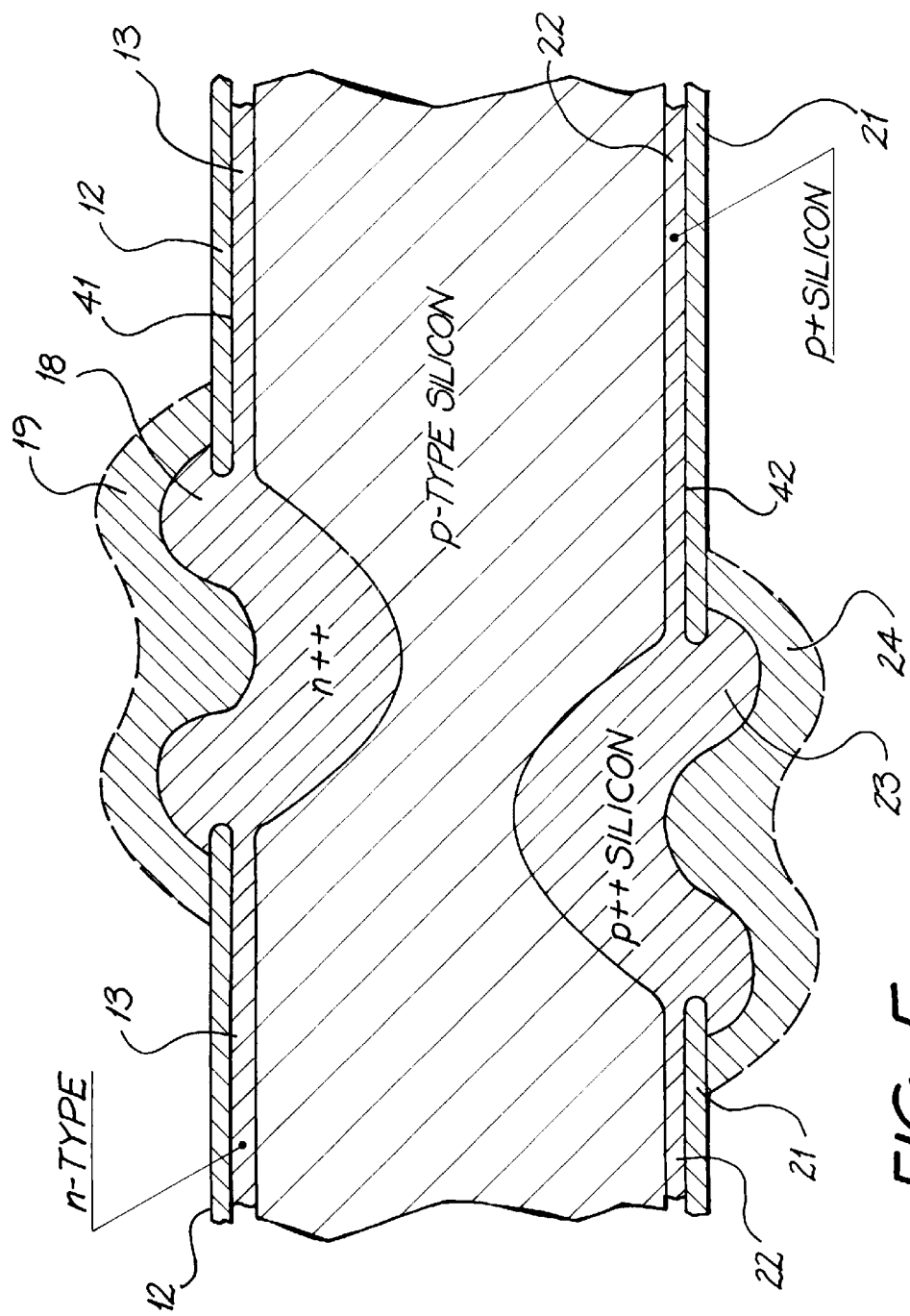
FIG. 5 is a cross section through a partially fabricated solar cell according to a second embodiment of the invention in which the method of the present invention is used to form both front and rear contacts.

In the examples given above, the invention has been applied to the light receiving surface 41 but could equally well be applied to the rear surface 42, using the opposite polarity of dopants in the dielectric. Application of the invention to both surfaces 41, 42 produces a bifacial solar cell of high performance as shown in FIG. 5 in which a second dielectric layer 21 is formed on the back surface of the semiconductor material 11, the dielectric material 21 being doped with the same dopant type as the body of the semiconductor material 11. An additional laser heating step is then used to create a heavily doped region 23 facilitating connection to the bulk region of the semiconductor material 11. Metallisation 24 is then added over the heavily doped region as with the top surface metallization 19. The corresponding processing sequence can be particularly simple, such as;

Example 3

3.1 Saw damage removal etch and anisotropic texturing in dilute sodium hydroxide at approximately 90° C.;
3.2 Application of dielectric containing n-type dopants onto the top surface;
3.3 Application of dielectric containing p type dopants onto the rear surface;
3.4 Thermal treatment to lightly diffuse n-type emitter and a p-type back-surface field across the rear. If necessary the thermal process includes treating the dielectric such as through oxidation to giver adequate resistance to the plating solutions;
3.5 Laser processing and patterning of the front dielectric;
3.6 Laser processing of the rear dielectric;
3.7 Simultaneous electroless metal plating of front and rear metal contact.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A self aligning method of forming contact metallization in a solar cell, the method including the steps of:
 a) on a surface of a semiconductor substrate of a first dopant type, forming a continuous layer of dopant source material of a second dopant type of opposite dopant polarity to that of the first dopant type, the source material being selected to also act as a surface passivation layer and a metallization pattern mask, or to be modifiable in situ to act as a surface passivation layer and a metallization pattern mask;
 b) thermally treating the dopant source material and the semiconductor surface carrying the dopant source, whereby a surface region of the second dopant type is formed in the semiconductor material, the first and second doped semiconductor types forming a p-n junction beneath the surface of the semiconductor substrate;
 c) locally heating the dopant source material and the underlying semiconductor surface, by scanning a beam of a laser over the area of the device where metallization is to be applied, to cause melting of the surface region in zones where metallization is required to contact to the surface region whereby the melted zones of the semiconductor surface region are more heavily doped from the dopant source material and the overlying dopant source material is disrupted to expose the more heavily doped surface zones, thereby simultaneously patterning the source material;
 d) forming metallization over the heavily doped surface zones such that connection to the surface region of the semiconductor material is made to the heavily doped surface zones through the disruption in the layer of dopant source material.

2. The method of claim 1, wherein the source material is selected to also act as an antireflection coating.

3. The method of claim 1, wherein the layer of dopant source material is a single layer of dielectric material carrying a dopant source whereby the dielectric material acts as a dopant source, a passivation layer, and a metallization mask.

4. A self aligning method of forming contact metallization in a solar cell, the method including the steps of:
 a) on a surface of a semiconductor substrate of a first dopant type, forming a continuous layer of dopant source material of a second dopant type of opposite dopant polarity to that of the first dopant type, the source material being selected to also act as a surface passivation layer, or to be modifiable in situ to act as a surface passivation layer;
 b) forming a metallization pattern mask over the layer of dopant source material;
 c) thermally treating the metallization pattern mask, the layer of dopant source material and the semiconductor surface carrying the dopant source, whereby a surface region of the second dopant type is formed in the semiconductor material, the first and second doped semiconductor types forming a p-n junction beneath the surface of the semiconductor substrate;
 d) locally heating the metallization pattern mask, the dopant source and the underlying semiconductor surface, by scanning a beam of a laser over the area of the device where metallization is to be applied, to cause melting of the surface region in zones where metallization is required to contact to the surface region whereby the melted zones of the semiconductor surface region are more heavily doped from the dopant source and the overlying metallization pattern mask and dopant source material are disrupted to expose the more heavily doped surface zones, thereby simultaneously patterning the source material;

e) forming metallization over the heavily doped surface zones such that connection to the surface region of the semiconductor material is made to the heavily doped surface zones through the disruption in the layer of metallization pattern mask and dopant source material.

5. The method of claim 4, wherein the a doped passivation layer is provided with a dielectric layer formed over it to act as a metallization mask, and the localised heating step disrupts both the doped passivation layer and the dielectric layer.

6. The method of claim 5, wherein one of the layers is also selected to act as an antireflection layer.

7. The method of claim 5, wherein a separate antireflection layer is provided in addition to the doped layer and the metallization mask.

8. The method as claimed in claim 1, wherein the first heating step is performed with parameters chosen to result in a surface region doping level in the range of 50–800 ohms per square.

9. The method of claim 8, wherein the first heating step is performed with parameters chosen to result in a surface region doping level in the range of 80–200 ohms per square.

10. The method of claim 1, wherein the laser is a continuous wave laser.

11. The method of claim 1, wherein the laser is pulsed (Q-switched) laser.

12. The method of claim 11, wherein the laser is defocussed to prevent excessive ablation during the heating step.

13. The method of claim 11, wherein the laser is operated at a wavelength at which laser energy will be absorbed close to the surface of the substrate to prevent excessive ablation during the heating step.

14. The method of claim 3, wherein the dielectric material is selected to also act as an antireflection coating.

15. The method of claim 4, wherein one of the layers is also selected to act as an antireflection layer.

16. The method of claim 4, wherein a separate antireflection layer is provided in addition to the doped layer and the metallization mask.

17. The method as claimed in claim 4, wherein the first heating step is performed with parameters chosen to result in a surface region doping level in the rang of 50–800 ohms per square.

18. The method of claim 17, wherein the first heating step is performed with parameters chosen to result in a surface region doping level in the range of 80–200 ohms per square.

19. The method of claim 4, wherein the laser is a continuous wave laser.

20. The method of claim 4, wherein the laser is a pulsed (Q-switched) laser.

21. The method of claim 20, wherein the laser is defocussed to prevent excessive ablation during the heating step.

22. The method of claim 20, wherein the laser is operated at a wavelength at which laser energy will be absorbed close to the surface of the substrate to prevent excessive ablation during the heating step.

* * * * *